United States Patent [19]

Muraoka et al.

[11] Patent Number: 5,766,402
[45] Date of Patent: Jun. 16, 1998

[54] APPARATUS FOR APPLYING TAPE TO OBJECT BY APPLYING PRESSURE THERETO

[75] Inventors: Nobuhiko Muraoka, Toyonaka; Shinjiro Tsuji, Hirakata; Shuichi Hirata, Moriguchi; Hirohisa Mozaki, Hirakata, all of Japan

[73] Assignee: Matsushita Electric Industrial Co., Ltd., Osaka, Japan

[21] Appl. No.: 413,437

[22] Filed: Mar. 30, 1995

[30] Foreign Application Priority Data

Mar. 30, 1994 [JP] Japan .................................. 6-061631

[51] Int. Cl.$^6$ .............................. B32B 31/08; B65H 26/02
[52] U.S. Cl. .......................... 156/361; 156/459; 156/469; 156/470; 156/540; 156/543
[58] Field of Search ................................ 156/361, 324, 156/443, 459, 469, 470, 540, 494–496, 543; 242/559.1

[56] References Cited

U.S. PATENT DOCUMENTS

| | | | |
|---|---|---|---|
| 4,792,103 | 12/1988 | Schoonderbeek | 242/559.1 X |
| 4,859,270 | 8/1989 | Martin et al. | 156/361 |
| 4,921,567 | 5/1990 | Criswell, Jr. | 156/361 |
| 4,990,213 | 2/1991 | Brown et al. | 156/459 X |
| 5,417,783 | 5/1995 | Boreali et al. | 156/361 X |
| 5,472,554 | 12/1995 | Ko et al. | 156/496 X |
| 5,480,508 | 1/1996 | Manabe et al. | 156/361 X |
| 5,534,105 | 7/1996 | Boyd | 156/543 X |

Primary Examiner—Richard L. Chiesa
Attorney, Agent, or Firm—Wenderoth, Lind & Ponack

[57] ABSTRACT

An apparatus, for applying a pressing tape to an object by applying pressure to the object, includes a pair of vertically movable members spaced at a certain interval. A tape-shaped material is traveled members and including a supporting tape carrying a pressing tape thereon. A pressure applying device is positioned between the movable members for pressing the tape-shaped member against an object. A tape feed-out device is provided upstream of one of the movable members for feeding out the tape-shaped material therefrom. A tape winding device is positioned downstream of the other movable member, for winding the tape-shaped material thereon. A tape feeding device is positioned between the other movable member and the winding device for feeding the tape-shaped material by a predetermined length by pulling the tape-shaped material. A first chuck is positioned on one movable member for chucking the tape-shaped material. A second chuck is positioned on the other movable member for chucking the tape-shaped material, and a third chuck device is provided for holding the tape-shaped material between the tape feeding device and the winding device.

13 Claims, 11 Drawing Sheets

APPARATUS FOR APPLYING TAPE TO OBJECT BY APPLYING PRESSURE THERETO

BACKGROUND OF THE INVENTION

The present invention relates to an apparatus for applying a pressing tape held on a supporting tape of a tape-shaped material to an object by a pressure-applying means by feeding the tape-shaped material by a predetermined length intermittently and moving the tape-shaped material downwardly toward the object.

In the process of manufacturing a liquid crystal panel, a tape-applying apparatus of this kind is used to bond an anisotropic conductive film tape to a transparent electrode positioned on a glass panel.

Referring to FIG. 7, the tape-applying apparatus includes a pair of vertically movable members 52 and 53 spaced at a predetermined interval; a tape-shaped material 51 spanned tight between the guide rollers 54 of the movable members 52 and 53; a feed-out means 55, positioned upstream of the movable member 52, for feeding the tape-shaped material 51 therefrom; a winding means 56, positioned downstream of the movable member 53, for winding the tape-shaped material 51 thereon; and a tape-feeding means 57, positioned between the movable member 53 and the winding means 56, for feeding the tape-shaped material 51 to the winding means 56 by a predetermined length by pulling it. The tape-feeding means 57 is so constructed that a roller 58 around which the tape-shaped material 51 has been wound is vertically moved by an NC-controlled moving means (not shown) with a high degree of positioning accuracy, as shown by an arrow of FIG. 7.

The movable member 53 includes comprises a tape fixing chuck 59 for chucking the tape-shaped material 51 and fixing it thereto. A tape feeding chuck 60 for chucking the tape-shaped material 51 during the feeding thereof is provided between the tape-feeding means 57 and the winding means 56. A tape slack-removing means 61 for feeding the tape-shaped material 51 is provided between the movable member 52 and the feed-out means 55. The tape slack-removing means 61 feeds the tape-shaped material 51 irrespective of the operation of the feed-out means 55 when the tape-shaped material 51 is being fed and when the movable members 52 and 53 are being moved downward. The tape slack-removing means 61 comprises a roller 62 around which the tape-shaped material 51 is wound and which is vertically movably supported and urged downwardly. When the roller 62 has reached an uppermost position, the feed-out means 55 is actuated, whereas when the roller 62 has reached the lowest position, the operation of the feed-out means 55 is stopped. An adjusting means 63 is provided between the tape feeding chuck 60 and the winding means 56. The adjusting means 63 feeds the tape-shaped material 51 when the movable members 52 and 53 are being moved downwardly. In order to control the stop of a tape-winding operation, the adjusting means 63 is provided with a roller 64 around which the tape-shaped material 51 is wound and which is vertically movably supported and is urged downwardly.

A stage 38 supporting a portion of an object to which a pressing tape is applied is provided between and below the movable members 52 and 53. A pressing means 66 for pressing the tape-shaped material 51 against the object is positioned above the stage 65.

The operation of the tape-applying apparatus having the above-described construction is described below.

In order to feed the tape-shaped material 51 by a required length, the tape feeding means 57 is actuated, with the tape feeding chuck 60 closed and the tape fixing chuck 59 open, to move the roller 58 downward, as shown by an arrow in FIG. 7. As a result, the tape-shaped material 51 is fed between the movable members 52 and 53, as shown by an arrow in FIG. 7. The slack caused by the amount of the tape-shaped material 51 which has been fed is removed by the upward movement of the roller 62 of the tape slack-removing means 61. Thereafter, the tape feeding chuck 60 is opened and the tape fixing chuck 59 is closed. Then, the winding means 56 is actuated so that the tape-shaped material 51 is wound around it. Consequently, the roller 58 of the tape-feeding means 57 is moved upward to the original position. Simultaneously with the termination of the winding operation which is detected by the start of the upward movement of the roller 64 of the adjusting means 63, the movable members 52 and 53 are moved downwardly to cause the tape-shaped material 51, tightly spanned therebetween, to contact the object mounted on the stage 65. Then, a pressure-applying means 66 is actuated to press the pressing tape carried by the supporting tape of the tape-shaped material 51 against the object. Thereafter, the movable members 52 and 53 are moved upward. The slacks caused by the feeding of the tape-shaped material 51 and the pull-up thereof resulting from the upward and downward movement of the movable members 52 and 53 are removed by the upward and downward movement of the roller 64 of the adjusting means 63 and that of the roller 62 of the tape slack-removing means 61. The pressing tape of the tape-shaped material 51 can be applied to the object by repeating the above operation.

The tape-applying apparatus having the above-described construction has, however, a problem. That is, the movable members 52 and 53 move downward, with only one end of the tape-shaped material 51 spanned tight between the movable members 52 and 53 being fixed to the tape fixing chuck 59 of the movable member 53. As a result, a tensile force generated by a resistance force resulting from the feeding of the tape-shaped material 51 from the tape slack-removing means 61 is applied to the tape-shaped material 51 in the range between the movable members 52 and 53. Consequently, the tape-shaped material 51 becomes longer. Thus, it becomes difficult to apply the pressing tape of the tape-shaped material 51 to the object with high positioning accuracy.

SUMMARY OF THE INVENTION

An object of the present invention is to provide an apparatus for applying a tape to an object by applying pressure thereto with a high degree of positioning accuracy by preventing a tensile force from being applied to a tape-shaped material between a pair of movable members so as to prevent the tape-shaped material from becoming longer.

In accomplishing these and other objects, according to a first aspect of the present invention, there is provided an apparatus for applying a pressing tape to an object by applying pressure to the object. The apparatus includes a pair of vertically movable members spaced at a certain interval with a tape-shaped material being traveled therearound. The tape shaped material is a supporting tape carrying a pressing tape thereon. A pressure applying means is positioned between the movable members for pressing the tape-shaped member against an object. A tape feed-out means is provided upstream of one of the movable members for feeding out the tape-shaped material therefrom. A tape winding means is positioned downstream of the other movable member for winding the tape-shaped material thereon. A tape feeding means is positioned between the other movable member and the winding means for feeding the tape-shaped material by a predetermined length by pulling the tape-shaped material. A first chuck is positioned on one movable member for chucking the tape-shaped material. A second chuck is positioned on the other movable member for chucking the tape-shaped material. Also a third chuck means is provided for holding the tape-shaped material between the tape feeding means and the winding means.

According to a second aspect of the present invention, there is provided an apparatus for applying a pressing tape to an object by applying pressure to the object. The apparatus includes a pair of vertically movable members spaced at a certain interval with a tape-shaped material being traveled therearound. The tape-shaped material is a supporting tape carrying a pressing tape thereon. A pressure applying means is positioned between the movable members for pressing the tape-shaped member against an object. A tape feed-out means is provided upstream of one of the movable members for feeding out the tape-shaped material therefrom. A tape winding means is positioned downstream of the other movable member for winding the tape-shaped material thereon. A tape feeding means is positioned between the other movable member and the winding means for feeding the tape-shaped material by a predetermined length by pulling the tape-shaped material. A first chuck is positioned on one movable member for chucking the tape-shaped material. Also a second chuck is positioned on the other movable member for chucking the tape-shaped material. The tape feeding means includes a rotatable drum and an endless belt to be pressed against the tape-shaped material which is sandwiched between the drum and the endless belt.

According to a third aspect of the present invention, there is provided an apparatus for applying a pressing tape to an object by applying pressure to the object. A pair of vertically movable members are spaced at a certain interval with a tape-shaped material being traveled therearound. The tape-shape material is a supporting tape carrying a pressing tape thereon. A pressure applying means is positioned between the movable members for pressing the tape-shaped member against an object. A tape feed-out means is provided upstream of one of the movable members for feeding out the tape-shaped material therefrom. A tape winding means is positioned downstream of the other movable member for winding the tape -shaped material thereon. A tape feeding means is positioned between the other movable member and the winding means for feeding the tape-shaped material by a predetermined length by pulling the tape-shaped material. Also first chuck is positioned on one movable member for chucking the tape-shaped material. The tape feeding means includes a rotatable drum and an endless belt to be pressed against the tape-shaped material sandwiched between the drum and the endless belt.

BRIEF DESCRIPTION OF THE DRAWINGS

These and other objects and features of the present invention will become clear from the following description taken in conjunction with the preferred embodiments thereof with reference to the accompanying drawings, in which.

DETAILED DESCRIPTION OF THE PREFERRED EMBODIMENTS

Figure 1:
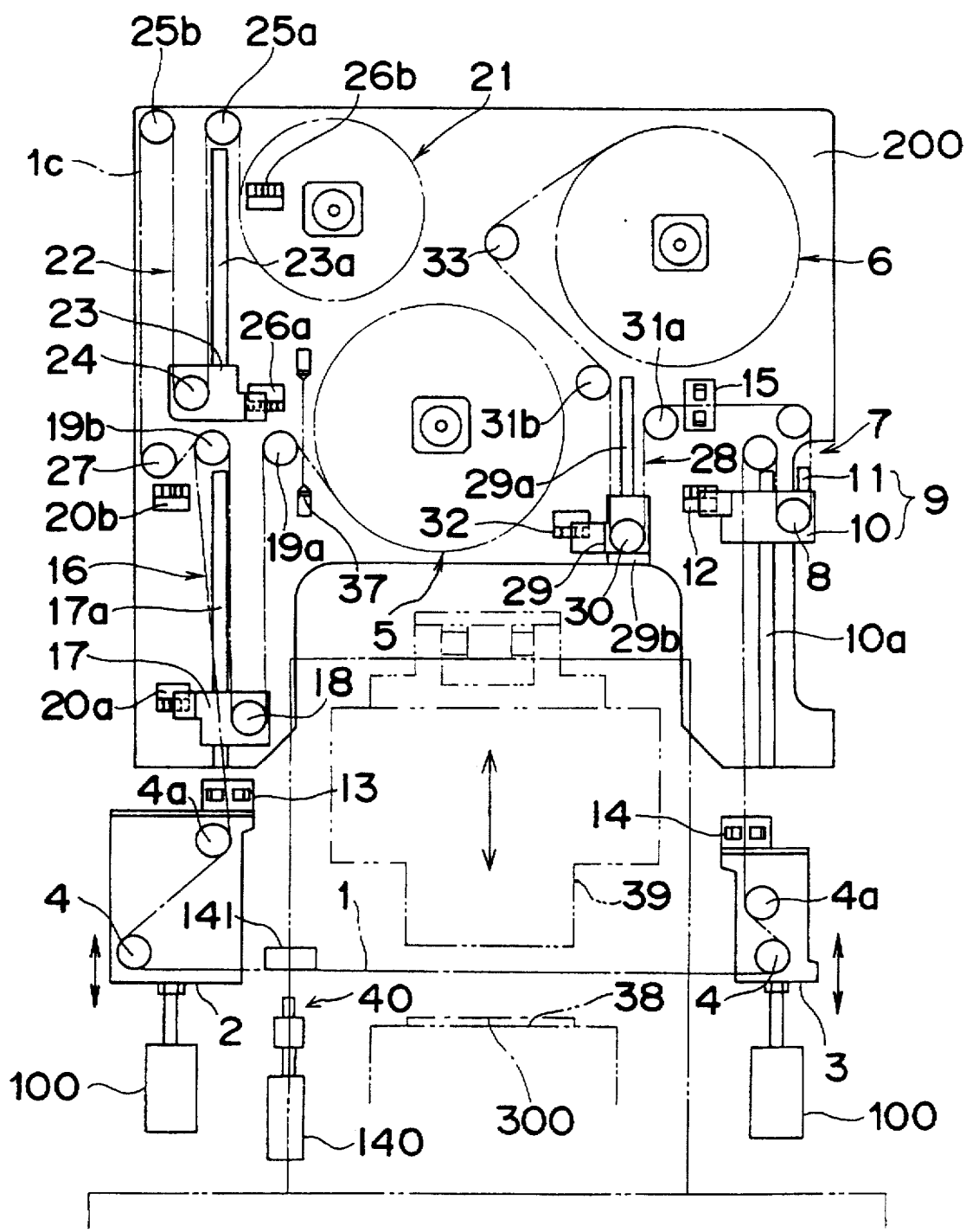
FIG. 1 is a view showing a schematic construction of an apparatus for applying a tape to an object by applying pressure thereto according to a first embodiment of the present invention.

Before the description of the present invention proceeds, it is to be noted that like parts are designated by like reference numerals throughout the accompanying drawings.

Embodiments of the present invention are described below with reference to FIGS. 1 through 6 and 8 through 12.

Referring to FIGS. 1 through 4 and 8 through 12, an apparatus for applying a tape to an object 300, such as a rectangular glass panel constituting a liquid crystal panel, by applying pressure thereto according to a first embodiment of the present invention is described below. A pair of movable members 2 and 3, which can be moved upward and downward by driving cylinders 100, is provided by spacing the members at a certain interval. A tape-shaped material 1 is spanned tight between guide rollers 4 provided on the movable members 2 and 3. Each of the movable members 2 and 3 include a sub-guide roller 4a provided above each of the guide rollers 4. A feed-out means 5 for feeding out the tape-shaped material 1 is provided upstream of the movable member 2. A winding means 6 for winding the tape-shaped material 1 thereon is provided downstream of the movable member 3. A tape feeding means 7 for feeding the tape-shaped material 1 by a predetermined length by pulling it is provided between the movable member 3 and the winding means 6. The tape feeding means 7 includes a roller 8, around which the tape-shaped material 1 has been wound which is moved downwardly by a moving means 9. The moving means 9 includes: a movable member 10 on which the roller 8 is mounted and which is vertically movably supported along a vertical guide 10a; and a driving plate 11 which engages the upper end of the movable member 10 and is moved downwardly with a high degree of positioning accuracy under an NC control. A sensor 12, such as a photoelectric detector, detects the movable member 10 when the movable member 10 has returned to the original position.

Figure 9:
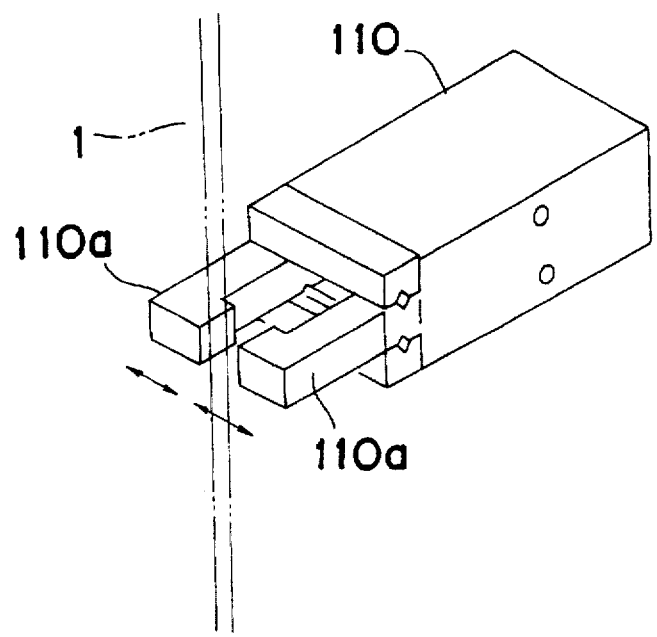
FIG. 9 is a perspective view of a chuck in the apparatus of FIG. 1.

A first chuck 13 and a second chuck 14 are provided at upper portions of the movable members 2 and 3, and respectively chuck the tape-shaped material 1 during the vertical movement of the movable members 2 and 3. A third chuck 15, provided between the tape feeding means 7 and the winding means 6, chucks the tape-shaped material 1 while the tape-shaped material 1 is being fed. Each chuck of the first through third chucks 13, 14, and 15 has the same construction in that a pair of chuck elements 110a are closed and opened by an air cylinder provided in a chuck body 110 as shown in FIG. 9 to hold or release the tape-shaped material 1 with the chuck elements 110a.

A tape slack-removing means 16 for feeding the tape-shaped material 1 is provided between the movable member 2 and the feed-out means 5. The tape slack-removing means 16 feeds the tape-shaped material 1 irrespective of the operation of the feed-out means 5 when the tape-shaped material 1 is being fed and when the movable members 2 and 3 are being moved downwardly. The tape slack-removing means 16 includes a roller 18 around which the tape-shaped material 1 is wound and which is installed on a movable member 17 vertically movably supported along a vertical guide 17a and urged downward by a weight. A pair of guide rollers 19a and 19b for guiding the tape-shaped material 1 toward the roller 18 is provided on the upper end of a moving path of the roller 18. Sensors 20a and 20b such as photoelectric detectors detect the lowest position and the uppermost position of the roller 18, respectively. When the sensor 20b is turned on by detecting that the roller 18 reaches the uppermost position, the feed-out means 5 is actuated. When the sensor 20a is turned on by detecting that the roller 18 reaches the lowest position, the operation of the feed-out means 5 is stopped.

Figure 2A:
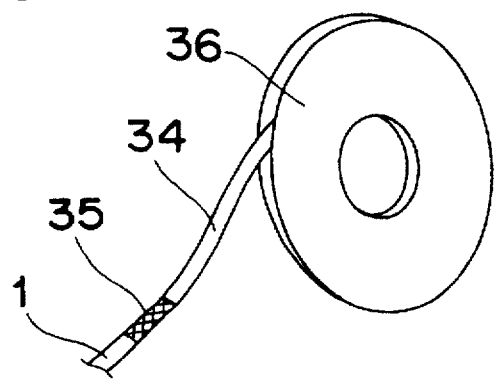
FIGS. 2A and 2B are a perspective view and a side view showing a termination of a tape-shaped material according to the first embodiment of the present invention.
Figure 2B:
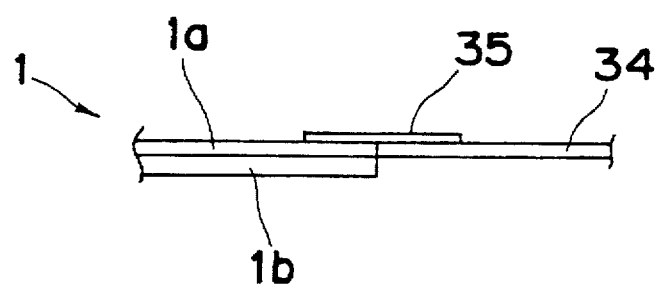

In the tape-shaped material 1 according to the first embodiment as shown in FIGS. 2A and 2B, a supporting tape 1a holds a pressing tape 1b which covered with a cover tape 1c and made of ACF (anisotropic conductive film). The cover tape 1c is removed from the pressing tape 1b by the guide roller 19b and wound around a cover tape winding means 21. An adjusting means 22 is provided between the guide roller 19b and the cover tape winding means 21 so that the cover tape 1c can be smoothly wound around the cover tape winding means 21 in accordance with the intermittent feeding of the tape-shaped material 1. The adjusting means 22 includes a roller 24 around which the cover tape 1c is wound. The adjusting means 22 is installed on a movable member 23 which is vertically movably supported on a vertical guide 23a and urged downward by a weight. A pair of guide rollers 25a and 25b for guiding the cover tape 1c toward the roller 24 is provided on the upper end of a moving path of the roller 24. Sensors 26a and 26b, such as photoelectric detectors, detect the lowest position and the uppermost position of the roller 24, respectively. When the sensor 26a is turned on by detecting that the roller 24 reaches the lowest position, the cover tape winding means 21 is actuated. When the sensor 26b is turned on by detecting that the roller 24 reaches the uppermost position, the operation of the cover tape winding means 21 is stopped. A guide roller 27 is interposed between the guide roller 19b and the guide roller 25b.

An adjusting means 28 for feeding the tape-shaped material 1 during the downward movement of the movable members 2 and 3 and stopping the winding operation is provided between the third chuck 15 and the winding means 6. The adjusting means 28 includes a roller 30 around which the tape-shaped material 1 is wound and which is installed on a movable member 29 vertically movably supported on a vertical guide 29a having a stopper 29b at the lower end thereof and urged downwardly by a weight. A pair of guide rollers 31a and 31b for guiding the tape-shaped material 1 toward the roller 30 is provided on the upper end of a moving path of the roller 30. A sensor 32 such as a photoelectric detector detects the movable member 29 when the movable member 29 has moved upward from the state in which the movable member 29 is in contact with the stopper 29b at the lower limit position of the roller 30. When the sensor 32 is turned on by detecting the movable member 29, the operation of the winding means 6 is stopped. A guide roller 33 is interposed between the guide roller 31b and the winding means 6.

Figure 10:
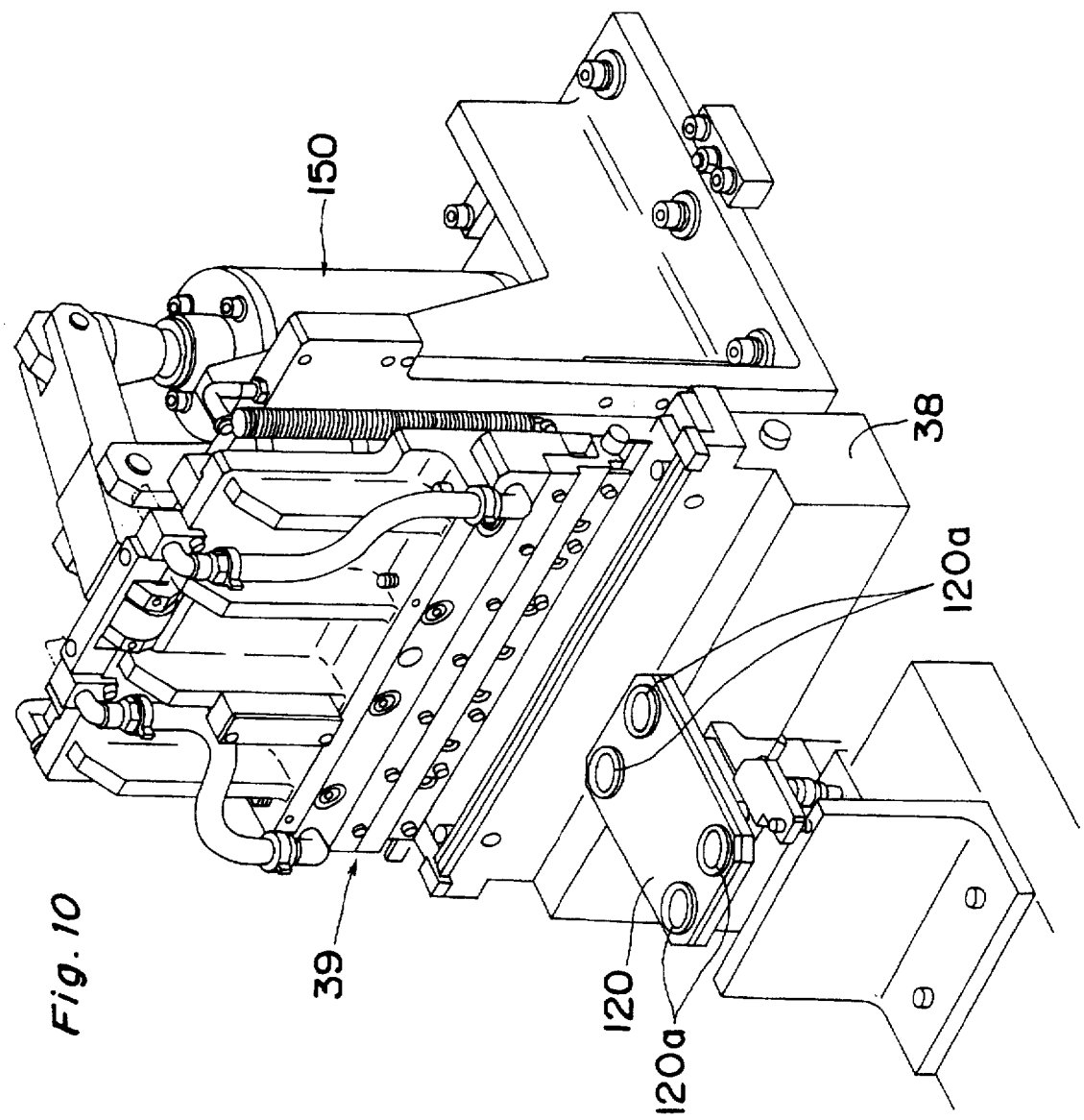
FIG. 10 is a perspective view of a pressing means in the apparatus of FIG. 1.

A stage 38 supporting a portion of the object 300 to which the pressing tape 1b is applied is provided between and below the movable members 2 and 3. A pressing means 39 for pressing the tape-shaped material 1 against the object 300 is positioned above the stage 38 and driven by a driving cylinder 150 as shown in FIG. 10. In FIG. 10, reference numeral 120 denotes an object holding means for sucking and holding the object 300 by suction pads 120a when a part of the object 300 is supported by the stage 38.

Each guide 10a, 17a, 23a, 29a may be composed of a linear motion guide device provided on a base 200 on which the feeding means 5, the winding means 6, and tape feeding means 7 etc, are provided. The feeding means 5 and winding means 6 are driven by corresponding motors (not shown). The driving plate 11 is driven by a driving means such as a cylinder under control of a control means 70 described later. The cover tape winding means 21 is urged by a spring so as to wind the cover tape 1c.

Figure 12:
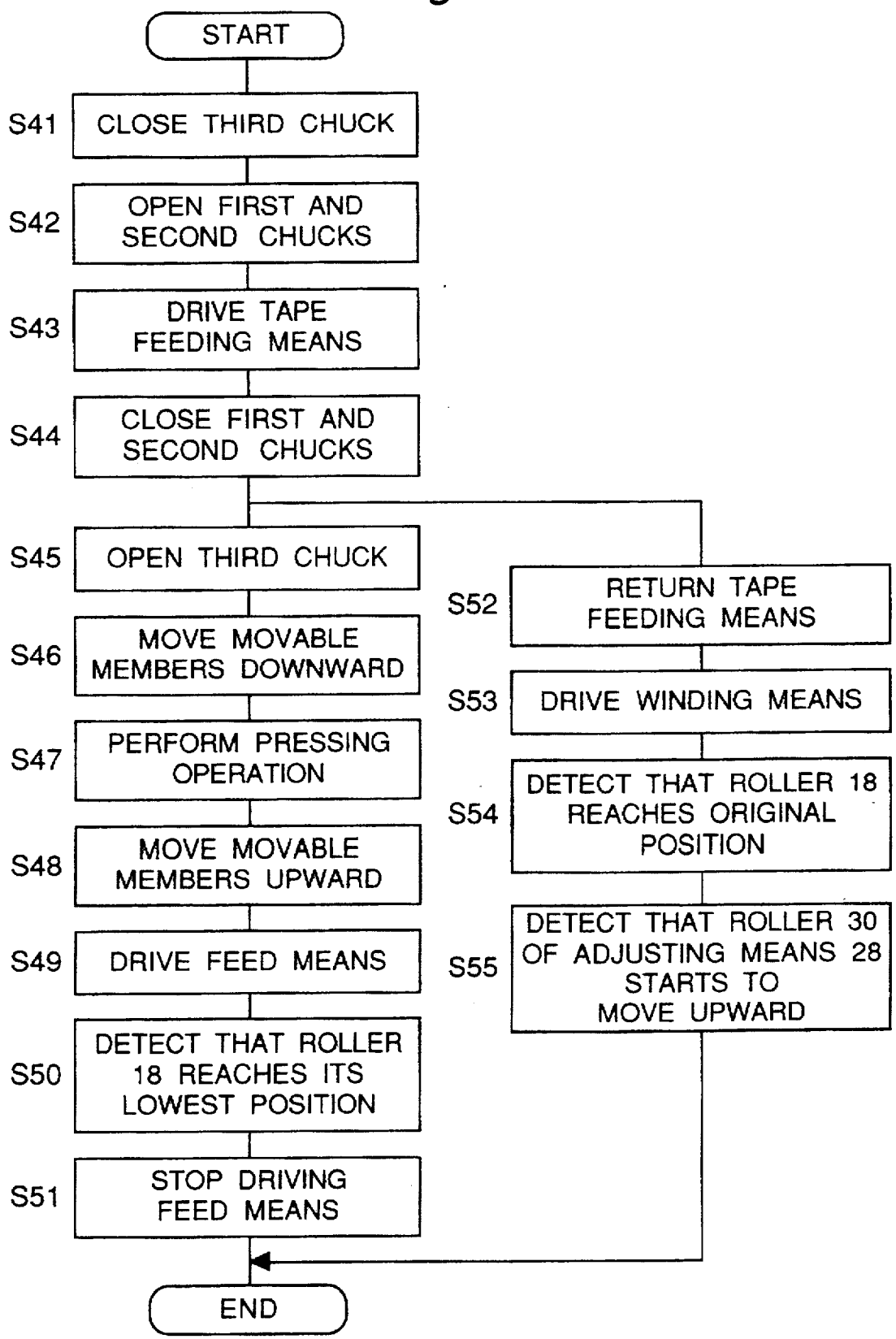
FIG. 12 is a control flowchart showing one operation of the apparatus of FIG. 1.

The operation of the apparatus having the above-described construction is described below with reference to FIG. 12.

In order to feed the tape-shaped material 1 by a predetermined length, the tape feeding means 7 is actuated, with the third chuck 15 closed at step S41 and the first and second chucks 13 and 14 open at step S42, and then the roller 8 of the tape feeding means 7 is moved with high accuracy by a predetermined distance under the NC control at step S43. As a result, the tape-shaped material 1 is fed by the predetermined length accurately in the range between the guide rollers 4 of the movable members 2 and 3. At this time, the slack caused by the amount of the tape-shaped material 1 which has been fed is removed by the upward movement of the roller 18 of the tape slack-removing means 16. Then, the first and second chucks 13 and 14 are closed at step S44 and the third chuck 15 is opened at step S45 and then the movable members 2 and 3 are moved downwardly at step S46 to cause the tape-shaped material 1 to be pressed against the object 300 with no tensile force being applied to the tape-shaped material 1. In this state, the pressing means 39 applies pressure to the object 300 at step S47, thus applying the pressing tape 1b of the tape-shaped material 1 to the object 300. It is necessary to feed the tape-shaped material 1 downwardly on each side of the movable members 2 and 3 when the movable members 2 and 3 are moved downward. On the side of the movable member 2, the slack caused by the feeding of the tape-shaped material 1 is removed by the upward movement of the roller 18 of the tape slack-removing means 16, whereas on the side of the movable member 3, the slack caused by the feeding thereof is removed by the upward movement of the roller 8 of the tape feeding means 7 or the upward movement of the roller 30 of the adjusting means 28 at step S52.

The tape-shaped material 1 is wound around the winding means 6 at step S53 by the winding means 6 simultaneously with the start of operation of pressing the tape-shaped material 1 against the object 300. When the roller 8 of the tape feeding means 7 has returned to the original position, the roller 8 is detected at step S54 by the sensor 12 and then stopped from further moving upward, and the roller 30 of the adjusting means 28 starts to move upwardly. At this time, the roller 30 is detected by the sensor 32 at step S55, and then the operation of the winding means 6 is stopped.

The slack caused by the amount of the tape-shaped material 1 corresponding to the fed amount thereof is removed by the downward movement of the roller 18 of the tape slack-removing means 16 and the downward movement of the roller 30 of the adjusting means 28 when the movable members 2 and 3 move upwardly at step S48. The movable members 2 and 3 move upward at step S48 with the first and second chucks 13 and 14 which are closed after the adhering of the tape-shaped material 1 to the object 300, in order to separate the supporting tape 1a from the pressing tape 1b which is now adhered to the object 300. As a result of this, only the pressing tape 1b is surely adhered to the object 300. Then, the tape feeding means 5 is driven at step S49 to feed the tape-shaped material 1 and then, when the sensor 20a detects that the roller 18 reaches its lowest position at step S50, the driving of the tape feeding means 5 is stopped at step S51.

The pressing tape 1b of the tape-shaped material 1 can be applied to the object 300 by repeating the above operation.

In the first embodiment, a dummy tape 34 having a certain length and composed of only a supporting tape is connected at the termination of the tape-shaped material 1 to be supplied to the feed-out means 5, as shown in FIGS. 2A and 2B. A termination mark 35 for indicating the termination of the tape-shaped material 1 is formed at the boundary between the tape-shaped material 1 and the dummy tape 34. The dummy tape 34 is wound around a reel 36. For example, the length of the dummy tape 34 may be set to be more than the length required to complete the application of the pressing tape 1b of the tape-shaped material 1 to an object 300. Therefore, after the termination mark 35 is detected, the operation of applying the pressing tape 1b to the object 300 can be prevented from being suspended. The color of the termination mark 35 can be changed. That is, if the tape-shaped material 1 is transparent, the termination mark 35 is formed to be untransparent, whereas if the tape-shaped material 1 is untransparent, the termination mark 35 is formed to be transparent. A sensor 37 such as a light penetrating type of photoelectric detector is provided in the vicinity of the feed-out means 5 to detect the termination mark 35, as shown in FIG. 1. The detection of the termination mark 35 by the sensor 37 eliminates a possibility that the tape-shaped material 1 is exhausted while the operation of applying the pressing tape 1b to the object 300 is being performed and that the apparatus is erroneously stopped. That is, after the termination mark 35 is detected, the operation of applying the pressing tape 1b to one object 300 is continued to complete the operation. Then, the operation of the apparatus is stopped to supply the apparatus with a new tape-shaped material 1. Thus, the replacement of the tape-shaped material 1 can be accomplished efficiently.

Figure 3A:
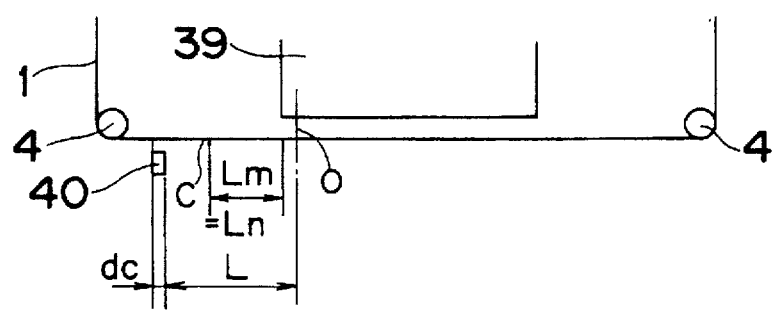
FIGS. 3A, 3B, and 3C are explanatory views showing operations of cutting a pressing tape according to the first embodiment of the present invention.
Figure 3B:
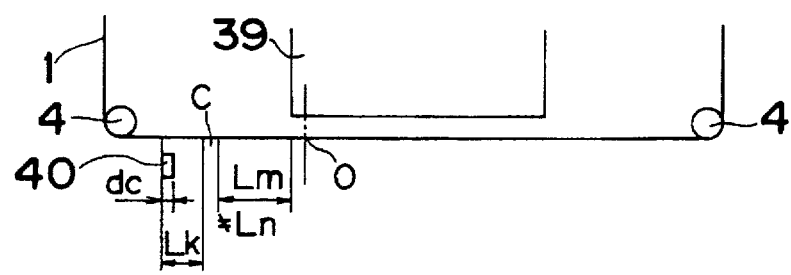
Figure 3C:
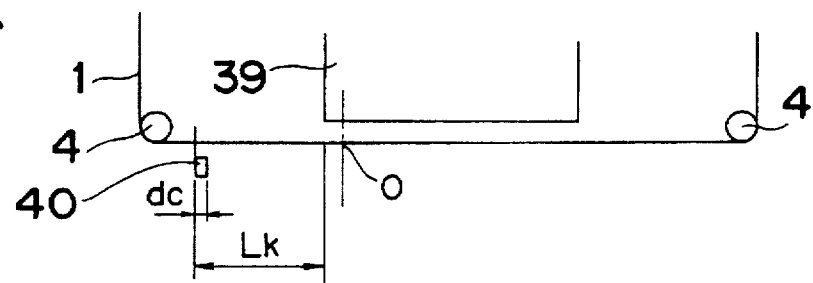
Figure 11:
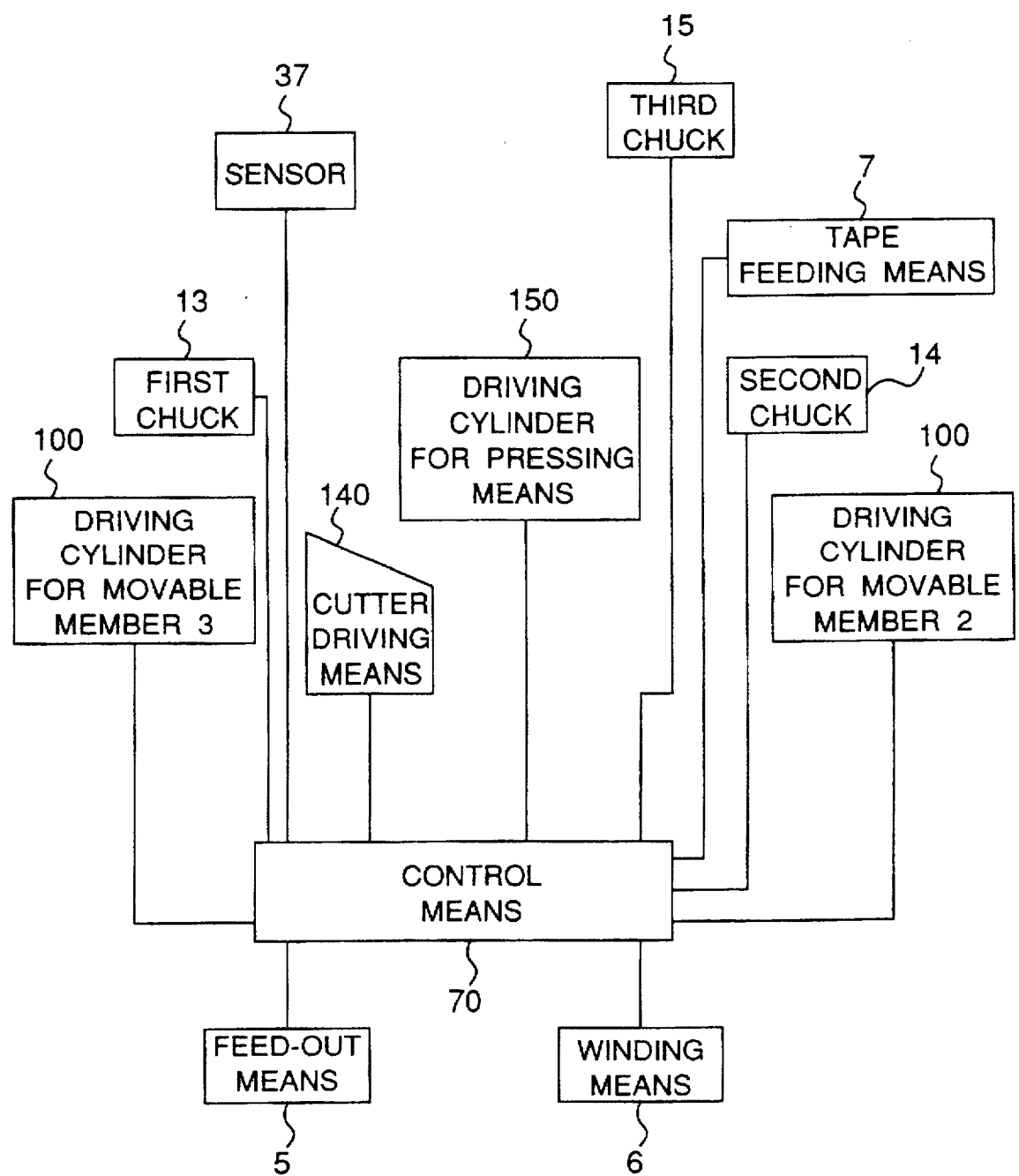
FIG. 11 is a block diagram showing electrical connection of a control means and other means in the apparatus of FIG. 1.

In the first embodiment, as shown in FIGS. 3A through 3C, a cutter 40 for cutting the pressing tape 1b of the tape-shaped material 1 to a predetermined length is provided in the vicinity of the guide roller 4 of the movable member 2. The cutter 40 is driven by a driving cylinder 140 to move the cutter 40 upwardly in FIG. 1 against a tape receiving member 141 with the supporting tape 1a and the pressing tape 1b held between the cutter 40 and the tape receiving member 141. Further, as shown in FIG. 11, there is provided a control means 70 for controlling the operation of the tape feeding means 7 and that of the cutter driving means 140 for driving the cutter 40 based on the distance between a reference end of a region to be pressed by the pressing means 39 and the cutter 40 and the length of the pressing tape 1b to be fed into the to-be-pressed region in a subsequent process. As shown in FIG. 11, the control means 70 also controls the operations of the first, second, and third chucks 13, 14, and 15, the driving cylinders 100 for the movable members 2 and 3, the driving cylinder 150 for the pressing means 39, and the winding means 6. The detected signal of the sensor 37 is input in the control means 70.

The control operation of the control means 70 is described below in detail with reference to FIGS. 3A, 3B, 3C, and 4. FIG. 3A is an explanatory view showing a state in which a to-be-cut portion (C) of the pressing tape 1b is present between the reference end (O) of the to-be-pressed region and the cutter 40 and the pressing tape 1b which has been cut can be used. FIG. 3B is an explanatory view showing a state in which the to-be-cut portion (C) is present between the reference end (O) and the cutter 40 and the pressing tape 1b which has been cut cannot be used. FIG. 3C is an explanatory view showing a state in which the to-be-cut portion (C) is not present between the reference end (O) and the cutter 40.

Referring to FIGS. 3A–3C and 4, reference numeral (L) denotes the distance between the reference end (O) of the to-be-pressed region and the cutter 40; ($d_c$) is a width of the pressing tape 1b to be cut off; ($L_c$) is an amount of the tape-shaped material 1 (pressing tape 1b) to be fed in a cut-off operation; and ($L_k$) is an amount of the tape-shaped material 1 to be fed in replacing the tape-shaped material 1; and ($L_m$) is the length of the pressing tape 1b which has been cut off. If the length $L_m$ is 0, it indicates that the pressing tape 1b is not present. ($L_n$) and ($L_a$) are the length of the pressing tape 1b to be applied to the object 300. Reference symbol (n) of $L_n$ indicates a block on which a tape-applying operation is to be executed and (a) of $L_a$ indicates a block on which a cut-off operation is to be executed.

Figure 4:
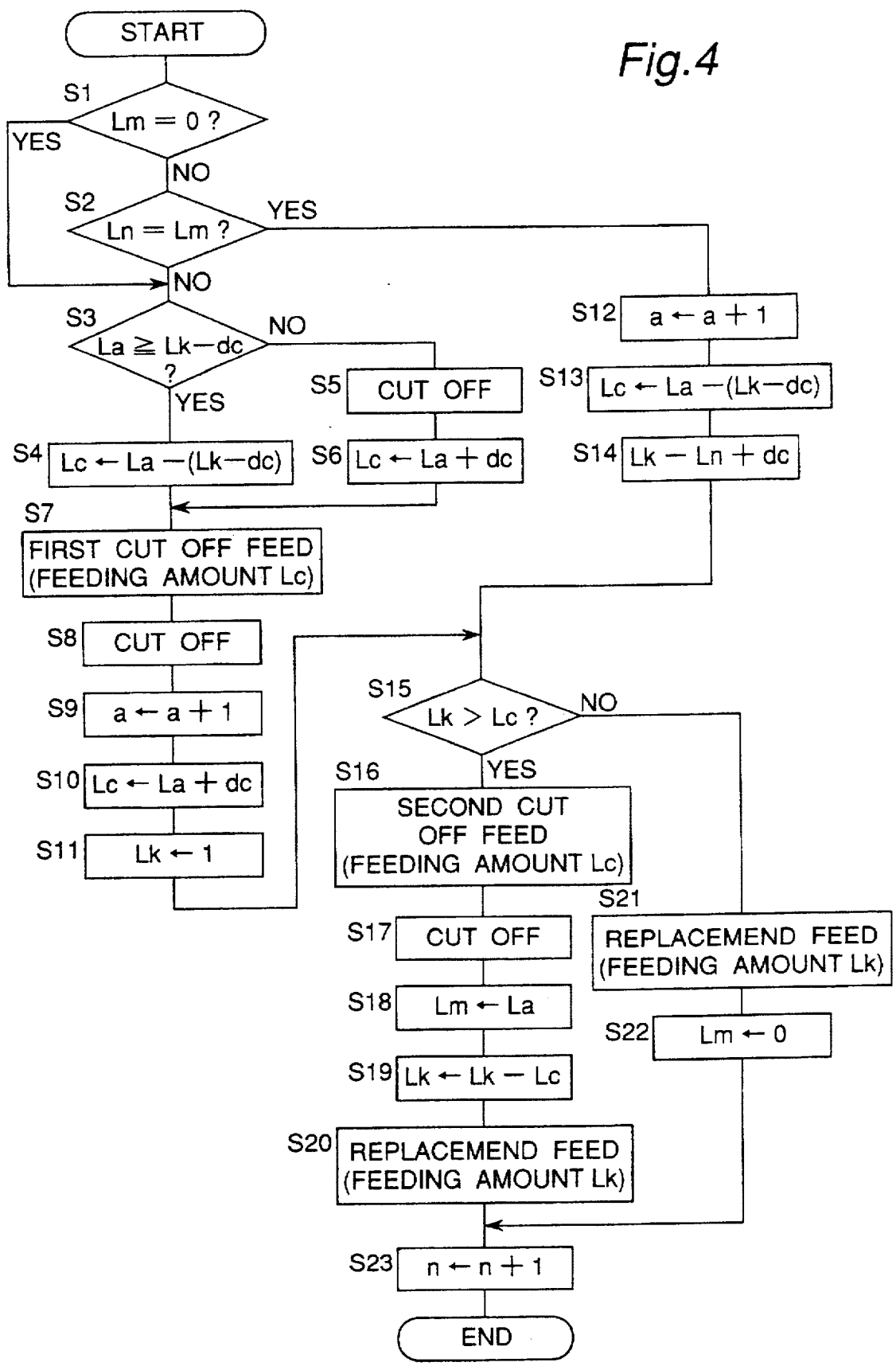
FIG. 4 is a control flowchart showing the 5 operation of cutting the pressing tape according to the first embodiment of the present invention.

Referring to FIG. 4, it is decided at step S1 whether or not $L_m=0$, i.e., whether or not the pressing tape 1b which has been cut off is present. If yes, it is decided at step S2 whether or not $L_n=L_m$, i.e., it is decided whether the pressing tape 1b can be used. If yes, "1" is added to (a) (see FIG. 3A) at step S12 so as to cut off a subsequent cut-off block of the pressing tape 1b. At step S13, the amount $L_c$ to be fed in the cut-off operation is calculated by $L_a-(L_k-d_c)$. The amount $L_k$ to be fed in replacing the tape-shaped material 1 is calculated by $L_n + d_c$.

If the pressing tape 1b which has been cut off is not present (see FIG. 3C) at step S1 or if the pressing tape 1b which has been cut off cannot be used even though the pressing tape 1b which has been cut off is present (see FIG. 3B) at step S2, it is decided at step S3 whether or not $L_a \geq L_k-d_c$ i.e., it is decided whether or not the tape-shaped material 1 has been fed excessively. If the tape-shaped material 1 has not been fed excessively, the amount $L_c$ to be fed in the cut-off operation is calculated by $L_a-(L_k-d_c)$ at step S4. If the tape-shaped material 1 has been fed excessively, the pressing tape 1b is cut off immediately at step S5, and then, the amount $L_c$ to be fed in the cut-off operation is calculated by $L_a+d_c$ at step S6. Then, at step S7, a first tape feeding for cut-off is performed based on the amount $L_c$, and then, the pressing tape 1b is cut off at step S8. Thereafter, at step S9, "1" is added to (a) so as to cut off the subsequent cut-off block of the pressing tape 1b. Then, the amount $Lc$ is calculated by $L_a + d_c$ at step S10. At step S11, the amount $L_k$ is set to "1".

Thereafter, based on the amounts $L_c$ and $L_k$ obtained at steps S10 and 11 or at steps S13 and S14, it is decided at step S15 whether or not the amount $L_k$ is greater than the amount $L_c$, i.e., it is decided at step S15 whether or not it is necessary to cut off the pressing tape 1b again. If it is unnecessary to cut off the pressing tape 1b again, at step S21, the tape-shaped material 1 is fed for the replacement thereof based on the amount Lk, and then, at step S22, $L_m$ is set to "0". If necessary, a second tape feeding for cut-off is performed based on the amount $L_c$ at step S16, and then, the pressing tape 1b is cut off at step S17. Then, the value of the length Lm is set to $L_a$ at step S18, and then, the amount Lk is calculated by $L_k$–$L_c$ at step S19 so as to feed the tape-shaped material 1 for the replacement thereof, based on the amount $L_k$ at step S20. Subsequently to steps S20 and S22, at step S23, "1" is added to (n) so as to perform the operation of applying the pressing tape 1b to the object 300.

As described above, the operation of the tape feeding means 7 and that of the cutter 40 are controlled based on the distance between the cutter 40 and the reference end (O) of the region to be pressed by the pressing means 39 and the lengths $L_n$, $L_a$ of the pressing tape $1_b$ to be fed into the to-be-pressed region in a subsequent process. Therefore, even though the pressing tape $1_b$ which is shorter than the distance between the cutter 40 and the reference end (O) of the to-be-pressed region is present, the tape-applying operation can be continued.

Figure 5:
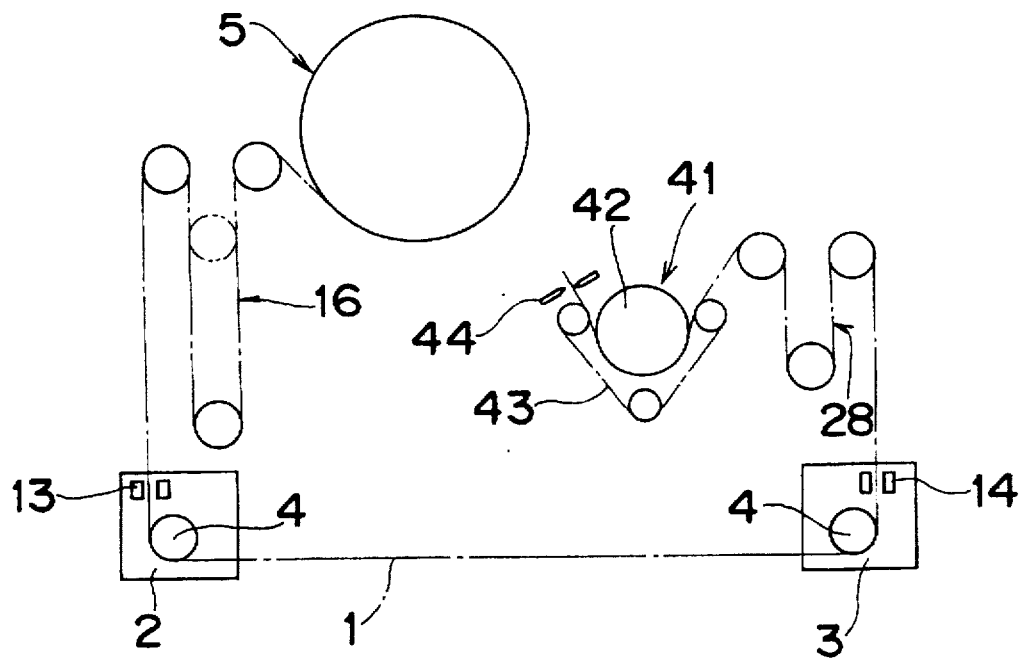
FIG. 5 is a view showing a schematic construction of an apparatus for applying a tape to an object by applying pressure thereto according to a second embodiment of the present invention.

An apparatus for applying a tape to an object by applying pressure thereto according to a second embodiment of the present invention is described below with reference to FIG. 5.

In the second embodiment, instead of the tape feeding means 7, the winding means 6, and the third chuck 15, there is provided a tape feeding means 41 including a rotatable drum 42 and an endless belt 43 to be pressed against the tape-shaped material 1 sandwiched between the outer periphery of the drum 42 and the endless belt 43. The tape-shaped material 1 fed out from the tape feeding means 41 is cut to pieces by a cutting means 44 and discarded.

In the second embodiment, the construction including the tape feeding means 41 having the rotatable drum 42 and the endless belt 43 allows the construction of the apparatus to be simple and the tape-shaped material 1 to be easily replaced.

Figure 6:
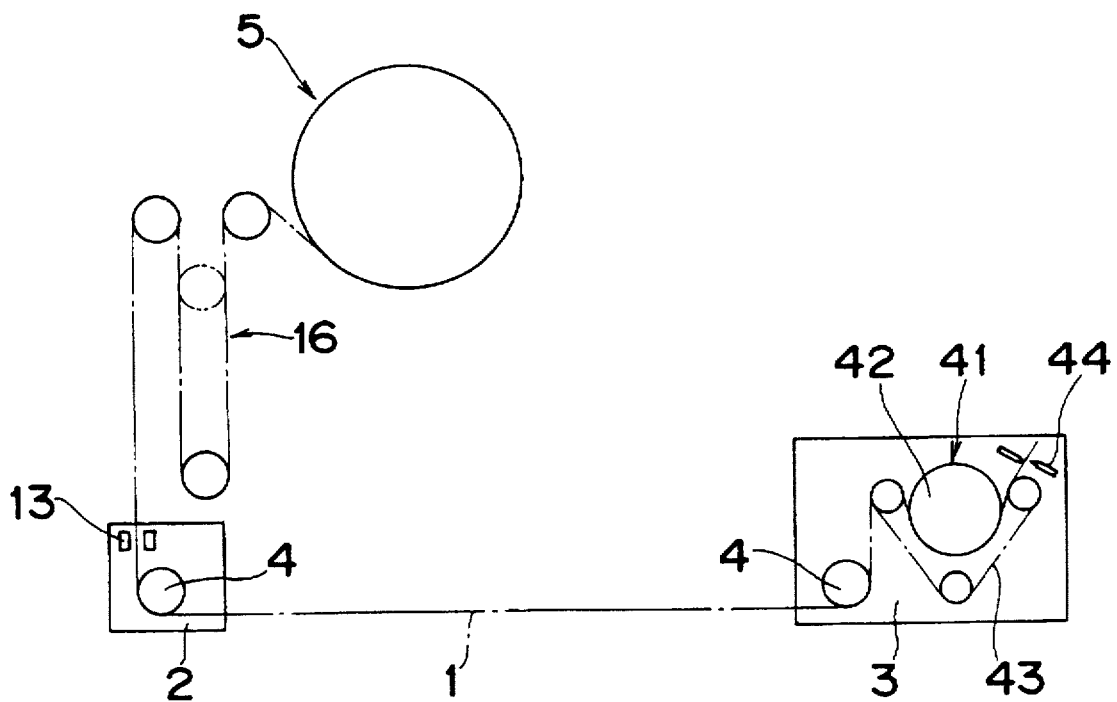
FIG. 6 is a view showing a schematic construction of an apparatus for applying a tape to an object by applying pressure thereto according to a third embodiment of the present invention.
Figure 7:
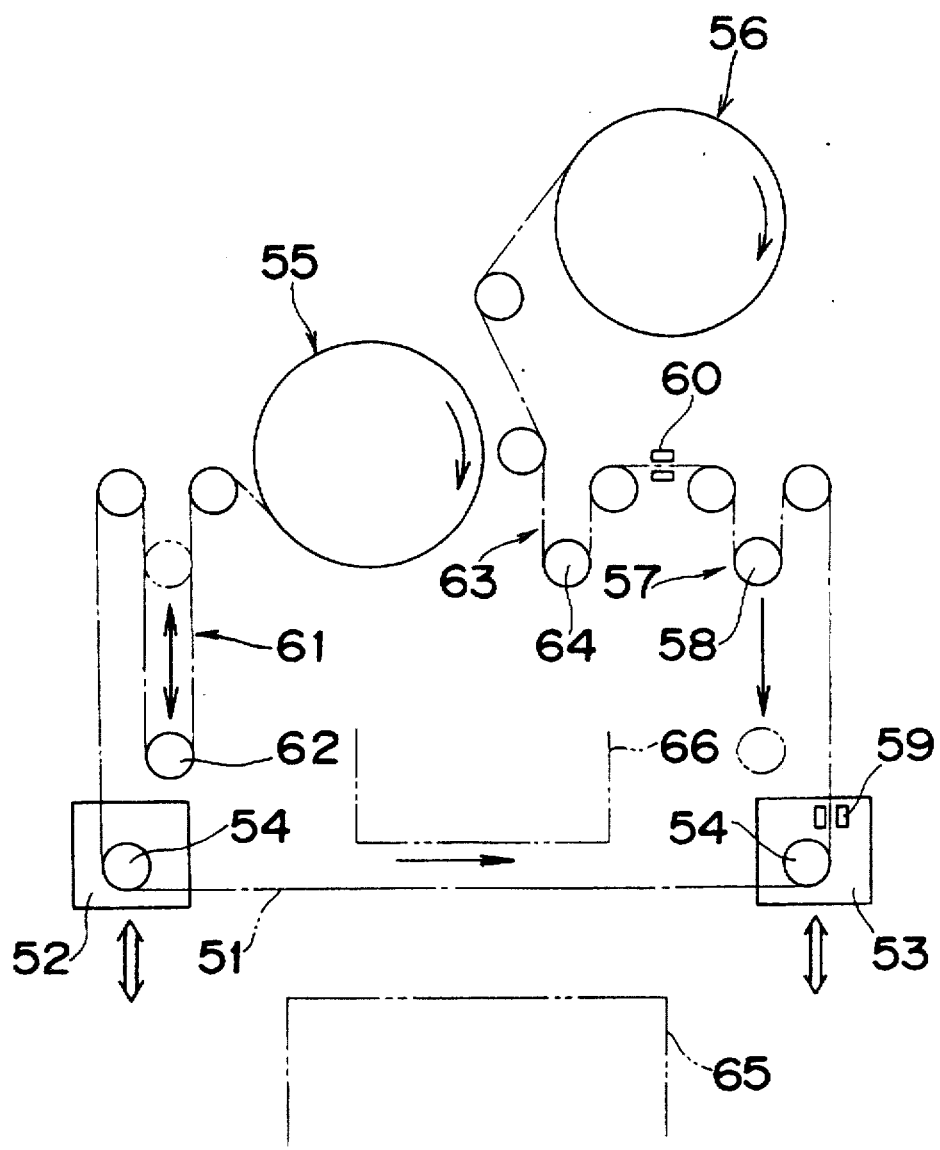
FIG. 7 is view showing a schematic construction of a conventional apparatus for applying a tape to an object by applying pressure thereto.
Figure 8:
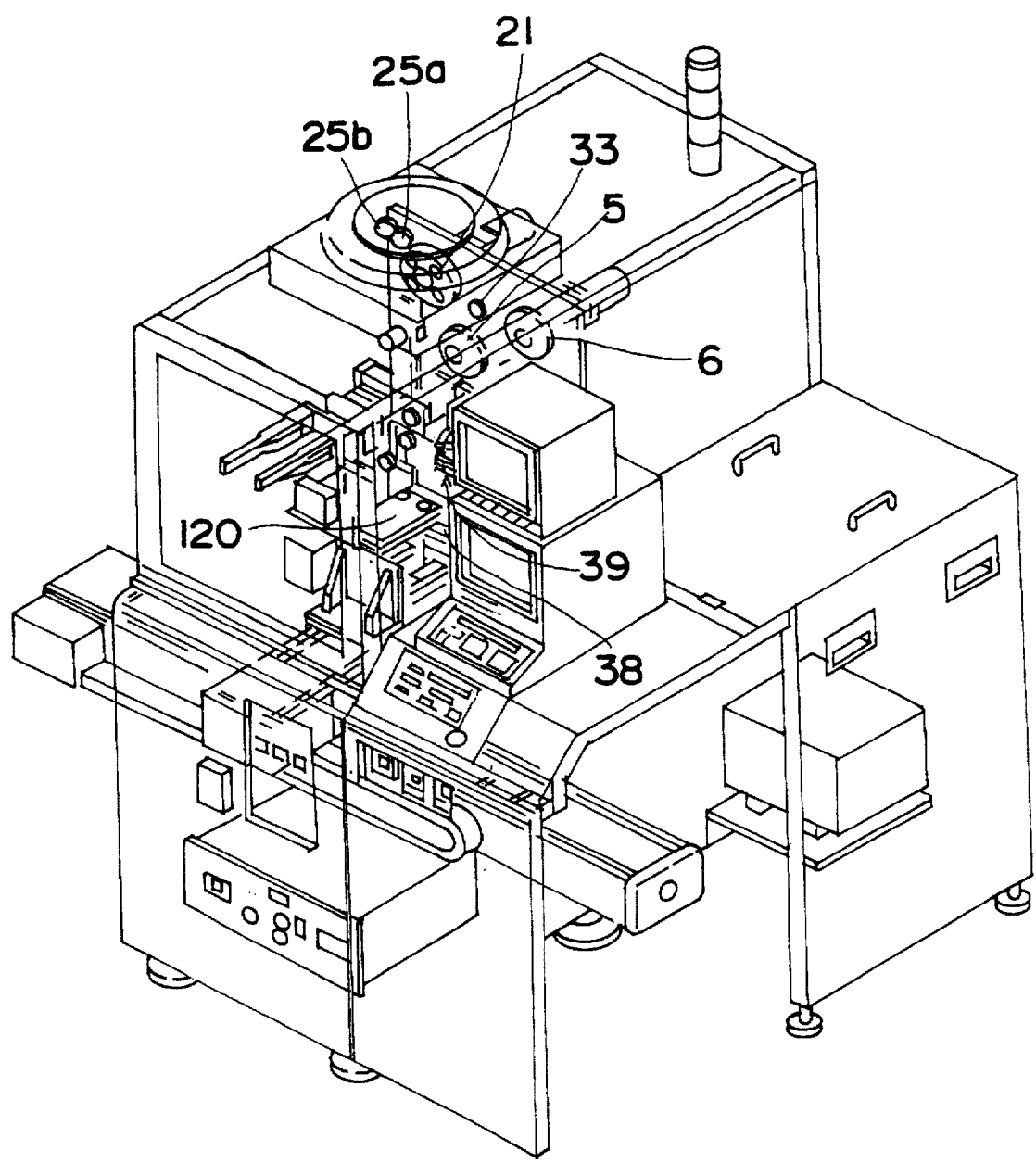
FIG. 8 is a perspective view of the apparatus of FIG. 1.

An apparatus for applying a tape to an object by applying pressure thereto according to a third embodiment of the present invention is described below with reference to FIG. 6. The apparatus according to the third embodiment has also the tape feeding means 41 of the second embodiment in the movable member 3 and does not have the adjusting means 28 required to feed and pull up the tape-shaped material 1 when the second chuck 14 and the movable member 3 move upwardly and downwardly.

The apparatus according to the third embodiment does not have the second chuck 14 or the adjusting means 28. Thus, the apparatus has a simple construction which can be manufactured at a low cost.

Each sensor in the embodiments may be composed of contactless switch instead of a photoelectric detector. The movable members 2 and 3 may be connected to each other and may be driven by one driving means such as a cylinder.

According to the first embodiment of the present invention, the tape feeding means is actuated to feed the tape-shaped material by a required length, with the third chuck holding the tape-shaped material. Then, the third chuck is opened and the first and second chucks are closed to move a pair of the movable members downward.

Therefore, pressure is applied to the tape-shaped material by the pressure-applying means, with the tape-shaped material pressed against the object 300 without tensile force being applied to the tape-shaped material. In this manner, the pressing tape of the tape-shaped material can be applied to the object 300 with a high degree of applied tape size accuracy. Simultaneously with the start of the operation of applying the pressing tape to the object 300, the tape-shaped material is wound around the winding means. As a result, the tape feeding means is returned to the original position.

According to the second embodiment of the present invention, instead of the complicated construction including the tape feeding means, the winding means, and the third chuck, the tape-shaped material is fed by the rotation of the drum, with the tape-shaped material sandwiched between the peripheral surface of the drum and the endless belt. This construction allows the apparatus to have a simple construction and the tape-shaped material to be easily replaced.

According to the third embodiment of the present invention, the tape feeding means of the second embodiment is provided in one of the movable members. This construction eliminates the need for the provision of the second chuck and the adjusting means required to feed and pull up the tape-shaped material when the movable members move upwardly and downwardly, and hence, the apparatus has a simple construction.

According to the embodiment of the present invention, the detecting means, positioned in the vicinity of the feed-out means, detects the termination mark formed at the boundary between the termination of the pressing tape-carrying portion of the tape-shaped material and the dummy tape which has having a predetermined length. This construction allows the tape-shaped material to be replaced at a suitable time after a tape-applying operation is completed without an error. Thus, the tape-shaped material can be replaced very efficiently.

According to the embodiment of the present invention, the operation of the tape feeding means and that of the cutter are controlled based on the distance between the cutter and the reference end of the region to be pressed by the pressing means and the length of the pressing tape to be fed into the to-be -pressed region in a subsequent process. Therefore, even though pressing tape, shorter than the distance between the cutter and the reference end of the to-be-pressed region is present, the tape-applying operation can be continued.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. An apparatus for applying a tape material, including a supporting tape and a pressing tape mounted on the supporting tape, to an object by applying pressure to the object, said apparatus comprising:

a pair of spaced vertically movable members;

a pressure applying means, positioned between said movable members, for pressing the tape material against an object;

a tape feed-out means for feeding out the tape material;

a tape winding means for winding the tape material thereon;

a tape feed path defined between said tape feed-out means and said tape winding means, wherein said pair of movable members are located along said tape feed path, said tape feed-out means is provided upstream of one of said movable members, and said tape winding means is provided downstream of the other of said movable members;

a tape feeding means, positioned along said tape feed path between said other movable member and said winding means, for feeding a predetermined length of the tape material by pulling the tape material;

a first chuck, positioned on one of said movable members, for clamping the tape material;

a second chuck, positioned on the other of said movable members, for clamping the tape material; and a third chuck, positioned between said tape feeding means and said winding means, for clamping the tape material.

2. The apparatus as claimed in claim 1, wherein when said movable members move downwardly, said first chuck and said second chuck are closed so as to hold the tape material therebetween.

3. The apparatus as claimed in claim 1, further comprising a detecting means, positioned in a vicinity of said feed-out means, for detecting a termination mark located between an end of the tape material and a dummy tape having a predetermined length.

4. The apparatus as claimed in claim 1, further comprising:

a cutter, located near one of said movable members, for cutting the pressing tape to a predetermined length; and a control means for controlling operation of said tape feeding means and operation of said cutter based on a distance between a reference end of a to-be-pressed region and said cutter and a length of the pressing tape to be fed into the to-be-pressed region in a subsequent operation.

5. An apparatus for applying a tape material, including a supporting tape and a pressing tape mounted thereon, to an object by applying pressure to the object, said apparatus comprising:

a pair of spaced vertically movable members;

a pressure applying means, positioned between said movable members, for pressing the tape material against an object;

a tape feed-out means for feeding out the tape material;

a tape winding means for winding the tape material thereon;

a tape feed path defined between said tape feed-out means and said tape winding means, wherein said pair of movable members are located along said tape feed path, said tape feed-out means is provided upstream of one of said movable members, and said tape winding means is provided downstream of the other of said movable members;

a tape feeding means, positioned along said tape feed path between said other movable member and said winding means, for feeding a predetermined length of the tape material by pulling the tape material;

a first chuck, positioned on one of said movable members, for clamping the tape material; and a second chuck, positioned on the other of said movable members, for clamping the tape material.

6. The apparatus as claimed in claim 5, wherein said tape feeding means comprises a rotatable drum and an endless belt which is pressed against said rotatable drum such that the tape material is sandwiched therebetween.

7. The apparatus as claimed in claim 6, wherein when said movable-members move in a downward direction, said first chuck and said second chuck are closed to clamp the tape material.

8. The apparatus as claimed in claim 6, further comprising a detecting means, positioned in a vicinity of said feed-out means, for detecting a termination mark located between an end of the tape material and a dummy tape having a predetermined length.

9. The apparatus as claimed in claim 6, further comprising:

a cutter, located near one of said movable members, for cutting the pressing tape to a predetermined length; and a control means for controlling operation of said tape feeding means and operation of said cutter based on a distance between a reference end of a to-be-pressed region and said cutter and a length of the pressing tape to be fed into the to-be-pressed region in a subsequent operation.

10. An apparatus for applying a tape material, including a supporting tape and a pressing tape mounted on the supporting tape, to an object by applying pressure to the object, said apparatus comprising:

a pair of spaced vertically movable members;

a pressure applicator positioned between said movable members for pressing the tape material against an object;

a tape feed-out device positioned upstream of a tape feed path relative to one of said movable members;

a tape winding device positioned downstream of the tape feed path relative to the other of said movable members;

a tape feeding device positioned along the tape feed path between said other movable member and said tape winding device;

a first tape chuck positioned on one of said movable members;

a second tape chuck positioned on the other of said movable members; and a third tape chuck positioned between said tape feeding device and said tape winding device.

11. The apparatus as claimed in claim 10, wherein when said movable members move vertically downward, said first tape chuck and said second tape chuck are closed so as to hold the tape material.

12. The apparatus as claimed in claim 10, further comprising a tape termination mark detector positioned in a vicinity of said tape feed-out device.

13. The apparatus as claimed in claim 10, further comprising:

a pressing tape cutter, located near one of said movable members, capable of cutting the pressing tape to a predetermined length; and a control means for controlling operation of said tape feeding device and operation of said pressing tape cutter based on a distance between a reference end of a to-be-pressed region and said cutter and a length of the pressing tape to be fed into the to-be-pressed region in a subsequent operation.

* * * * *